US006603168B1

(12) United States Patent  
Choi

(10) Patent No.: US 6,603,168 B1  
(45) Date of Patent: Aug. 5, 2003

(54) VERTICAL DRAM DEVICE WITH CHANNEL ACCESS TRANSISTOR AND STACKED STORAGE CAPACITOR AND ASSOCIATED METHOD

(75) Inventor: Seungmoo Choi, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/553,868

(22) Filed: Apr. 20, 2000

(51) Int. Cl.[7] ................ H01L 27/108; H01L 29/06; H01L 29/94

(52) U.S. Cl. .................. 257/306; 257/60; 257/302; 257/329

(58) Field of Search ............... 257/60, 302, 328–334, 257/306; 438/156, 206, 209, 212, 268

(56) References Cited

U.S. PATENT DOCUMENTS

| | | | |
|---|---|---|---|
| 5,140,389 A | 8/1992 | Kimura et al. ............. 357/23.6 |
| 5,234,856 A | 8/1993 | Gonzalez .................... 437/47 |
| 5,335,138 A | 8/1994 | Sandhu et al. ............. 361/303 |
| 5,414,289 A | * 5/1995 | Fitch ......................... 257/329 |
| 5,451,538 A | * 9/1995 | Fitch ......................... 438/253 |
| 5,661,063 A | 8/1997 | Lee ............................ 437/32 |
| 5,668,036 A | 9/1997 | Sune .......................... 438/253 |
| 5,712,813 A | 1/1998 | Zhang ........................ 365/149 |
| 5,780,888 A | * 7/1998 | Maeda ....................... 257/302 |
| 5,824,582 A | 10/1998 | Tseng ........................ 438/254 |
| 5,885,864 A | 3/1999 | Ma ............................ 438/253 |
| 5,885,882 A | 3/1999 | Schugraf et al. ........... 438/398 |
| 5,909,618 A | 6/1999 | Forbes et al. .............. 438/242 |
| 5,994,735 A | * 11/1999 | Maeda ....................... 257/329 |
| 6,027,975 A | 2/2000 | Hergenrother et al. ...... 438/268 |
| 6,078,072 A | * 6/2000 | Okudaira ................... 257/295 |

FOREIGN PATENT DOCUMENTS

| | | | |
|---|---|---|---|
| JP | 59-17285 | * | 1/1984 |
| JP | 61-67953 | * | 4/1986 |
| JP | 7-211792 | * | 8/1995 |

OTHER PUBLICATIONS

Van Zant, Microchip Fabrication: A Practical Guide to Semiconductor Processing, 4th ed, 2000, McGraw–Hill, New York, pp. 380–381.*

Hergenrother, et al. "The Vertical Replacement–Gate (VRG) MOSFET: A 50–nm Vertical MOSFET with Lithography-–Independent Gate Length" IDEM Tech Digest pp. 75–78, 1999.

Geppert, Linda. "Devices and Circuits" IEEE Spectrum pp. 68, 69, Jan. 2000.

* cited by examiner

Primary Examiner—Wael Fahmy  
Assistant Examiner—Marcos D. Pizarro-Crespo

(57) ABSTRACT

An integrated circuit memory device includes a substrate having at least one connection line therein and a plurality of memory cells formed on the substrate. Each memory cell includes a pillar comprising a lower source/drain region for a cell access transistor electrically connected to the connection line, an upper source/drain region for the cell access transistor, and at least one channel region extending vertically between the lower and upper source/drain regions. Each memory cell further includes at least one lower dielectric layer vertically adjacent the substrate and laterally adjacent the pillar and at least one upper dielectric layer vertically spaced above the at least one lower dielectric layer and laterally adjacent the pillar. Further, each memory cell includes at least one gate for the at least one channel of the cell access transistor between the lower and upper dielectric layers so that the vertical spacing therebetween defines a gate length for the cell access transistor. A storage capacitor is also included in each memory cell adjacent the upper source/drain region of the cell access transistor and is electrically connected thereto.

25 Claims, 11 Drawing Sheets

VERTICAL DRAM DEVICE WITH CHANNEL ACCESS TRANSISTOR AND STACKED STORAGE CAPACITOR AND ASSOCIATED METHOD

FIELD OF THE INVENTION

The present invention relates to electronic circuits, and, more particularly, to integrated circuit memory devices and related methods.

BACKGROUND OF THE INVENTION

The continuing trend in semiconductor integrated circuits is to increase circuit density and thereby provide more circuitry in a given area. In particular, memory-intensive devices such as the personal computer have driven the need for memory circuits having increased density. Thus, it is desirable to increase the number of memory cells on a memory chip, such as a dynamic random access memory (DRAM), to provide a greater amount of memory without increasing the size of the chip. A typical DRAM includes a plurality of storage cell, each cell including an access transistor and a storage capacitor connected to the access transistor.

One approach to increase the density of a DRAM cell is to vertically stack the capacitor on the access transistor. The result is a memory cell that takes up less horizontal area and allows more memory cells to be included on a chip. In addition, the stacked arrangement can also be used with a vertical channel access transistor to reduce the size of each cell, as disclosed, for example, in U.S. Pat. No. 5,885,864 to Ma entitled "Method for Forming Compact Memory Cell Using Vertical Devices."

Unfortunately, as the area for a memory cell is decreased, the area available for the storage capacitor also decreases. Accordingly, the capacitance available to accurately store information may also be reduced. In the above mentioned patent to Ma, a cylindrical stacked storage capacitor is used to provide sufficient capacitance in a relatively small area. Unfortunately, such a stacked cylindrical capacitor and vertical channel transistor may present considerable manufacturing difficulties. In particular, the vertical channel access transistor may be difficult to make while providing a controllable and consistent channel. In addition, the cylindrical capacitor structure may also be relatively complicated and difficult to scale upward for increased capacitance.

SUMMARY OF THE INVENTION

In view of the foregoing background, it is therefore an object of the present invention to provide an integrated circuit memory device having a relatively high density, while retaining adequate capacitance levels for proper device operation.

It is a further object of the present invention to provide such a memory device that can be readily manufactured.

These and other objects, features, and advantages of the present invention are provided by an integrated circuit memory device including a substrate having at least one connection line therein and a plurality of memory cells formed on the substrate. Each memory cell includes a pillar which may be formed of epitaxial silicon. The pillar includes a lower source/drain region for the cell access transistor and which is electrically connected to the at least one connection line in the substrate. The pillar also includes an upper source/drain region for the cell access transistor, and at least one channel region extending vertically between the lower source/drain region and the upper source/drain region. The pillar may be generally cylindrical or rectangular in shape.

Each memory cell may further include at least one lower dielectric layer vertically adjacent the substrate and laterally adjacent the pillar, and at least one upper dielectric layer vertically spaced above the at least one lower dielectric layer and laterally adjacent the pillar. Also included is at least one gate for the channel of the cell access transistor between the lower and upper dielectric layers so that the vertical spacing therebetween defines a gate length for the cell access transistor. The construction of the vertical channel access transistor permits accurate control of the length of the channel. A storage capacitor is included in each memory cell adjacent to the upper source/drain region of the cell access transistor and is electrically connected thereto.

A conductive source/drain layer may be provided between the upper source/drain region of the pillar and the storage capacitor. The conductive source/drain layer has an upper surface portion and vertical sidewall portions depending therefrom. An advantageous feature of the invention is that the storage capacitor may extend adjacent to the upper surface portion and also adjacent to the vertical sidewall portions of the conductive source/drain layer to hereby provide an increased area for the storage capacitor. The conductive source/drain layer can be extended vertically relatively easily to provide a relatively high capacitance, since the vertical sidewalls can be made relatively large. This is so even as the horizontal area of each cell is scaled downward.

At least one dielectric spacer may be provided adjacent the vertical sidewall portions of the conductive source/drain layer. The storage capacitor may comprise a first electrode layer adjacent to the upper source/drain region of the pillar that is electrically connected thereto, a dielectric layer adjacent to the first electrode layer, and a second electrode layer adjacent to the dielectric layer.

In accordance with another advantageous feature of the invention, at least one electrically conductive line may be preferably intermittently connected to the at least one connection line. The connection line may be provided by a doped substrate region, and the strapping may be a metal to thus lower an effective electrical resistance of the doped substrate region.

A method aspect of the present invention is for making an integrated circuit memory device. The method includes forming at least one connection line in a substrate and forming a pillar on the connection line. The pillar includes a lower source/drain region for a cell access transistor electrically connected to the at least one connection line, an upper source/drain region for the cell access transistor, and at least one channel region extending vertically between the lower source/drain region and the upper source/drain region The method further includes forming at least one lower dielectric layer vertically adjacent to the substrate and laterally adjacent to the pillar and forming at least one upper dielectric layer vertically spaced above the at least one lower dielectric layer and laterally adjacent to the pillar. Also, at least one gate is formed for the at least one channel of the cell access transistor between the lower and upper dielectric layers so that the vertical spacing therebetween defines a gate length for the cell access transistor. Further, a capacitor is formed adjacent to the upper source/drain region of the cell access transistor and electrically connected thereto.

DETAILED DESCRIPTION OF THE PREFERRED EMBODIMENTS

Figure 1:
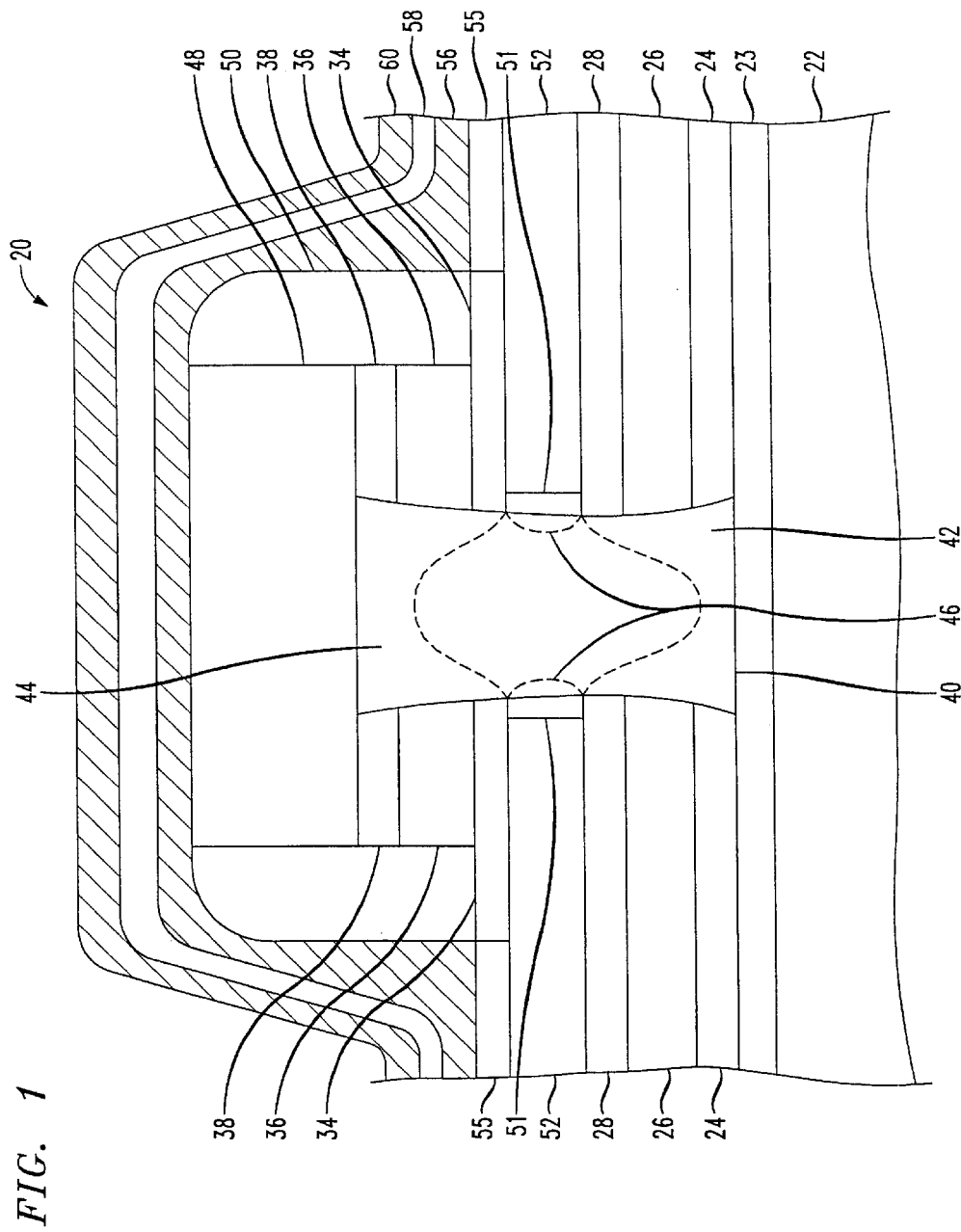
FIG. 1 is a cross-sectional view of a memory cell according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and double prime notation is used to indicate similar elements in alternate embodiments.

A memory cell 20 of an integrated circuit memory device according to the present invention is first described with reference to FIG. 1. The memory cell 20 includes a semiconductor substrate 22 having at least one connection line 23 therein. A pillar 40 has a lower source/drain region 42 electrically connected to the at least one connection line 23, an upper source/drain region 44, and at least one channel region 46 extending vertically between the lower source/drain region and the upper source/drain region. A conductive source/drain layer 48 is vertically adjacent the upper source/drain region 44 of the pillar 40. The conductive source/drain layer 48 has an upper surface portion and vertical sidewall portions depending therefrom, and at least one dielectric spacer 50 is formed adjacent the upper surface and vertical sidewall portions.

At least one lower dielectric layer illustratively includes in stacked relation: a first oxide layer 24, a second oxide layer 26 on the first oxide layer, and a silicon nitride layer 28 on the second oxide layer. The at least one lower dielectric layer is vertically adjacent the substrate 22 and laterally adjacent the pillar 40. At least one upper dielectric layer illustratively includes in stacked relation: a first silicone nitride layer 55, an oxide layer 36 on the first silicone nitride layer, and a second silicon nitride layer 38 on the oxide layer. The at least one upper dielectric layer is vertically above the at least one lower dielectric layer and laterally adjacent the pillar 40.

At least one gate is positioned between the at least one lower dielectric layer and the at least one upper dielectric layer and illustratively includes a conductive gate layer 52 and a gate oxide layer 51 between the conductive gate layer and adjacent portions of the pillar 40.

It will be appreciated that the above structure forms a cell access transistor for the memory cell 20. This cell access transistor is similar to a vertical metal-oxide semiconductor field-effect transistor (MOSFET) assigned to the assignee of the present invention and disclosed in U.S. Pat. No. 6,027,975 to Hergenrother et al. entitled "Process for Fabricating Vertical Transistors," which is hereby incorporated herein by reference in its entirety. The structure of the cell access transistor and its fabrication will be described below. However, further details regarding this vertical MOSFET and its fabrication can be found in the noted patent. Of course, it will be appreciated by one of skill in the art that the present invention may incorporate other embodiments of the vertical MOSFET disclosed in U.S. Pat. No. 6,027,975 and is not limited to the single embodiment described herein.

The memory cell 20 also includes a storage capacitor adjacent the upper source/drain region 44 of the cell access transistor that is electrically connected thereto. The storage capacitor includes a first electrode layer 56 adjacent the upper source/drain region 44 and which is electrically connected thereto by the conductive source/drain layer 48. A dielectric layer 58 is adjacent the first electrode layer 56, and a second electrode layer 60 is adjacent the dielectric layer. As illustrated in FIG. 1, the storage capacitor has a portion located over the conductive source/drain layer 48 and has a portion extending below the conductive source/drain layer 48. This arrangement provides increased area by vertically extending the storage capacitor.

Figure 2:
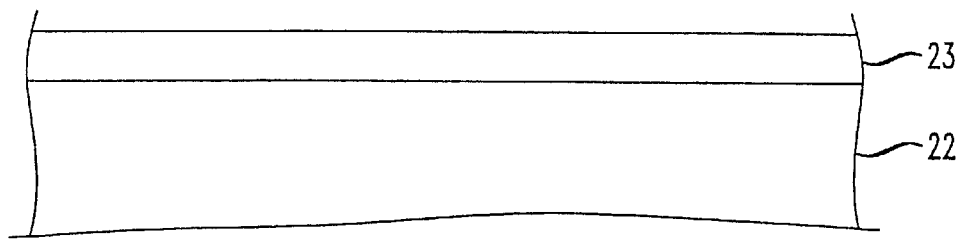
FIG. 2 is a cross-sectional view showing the formation of the connection line in the substrate of the memory cell of FIG. 1.

Fabrication of the memory cell 20 will be described with reference to FIGS. 2–9. A portion of the semiconductor substrate 22 may be degeneratively doped to form at least one connection line 23 therein for the memory cell 20, as shown in FIG. 2. The doping may be accomplished by ion implantation or other doping techniques as will be readily appreciated by those skilled in the art.

Figure 3:
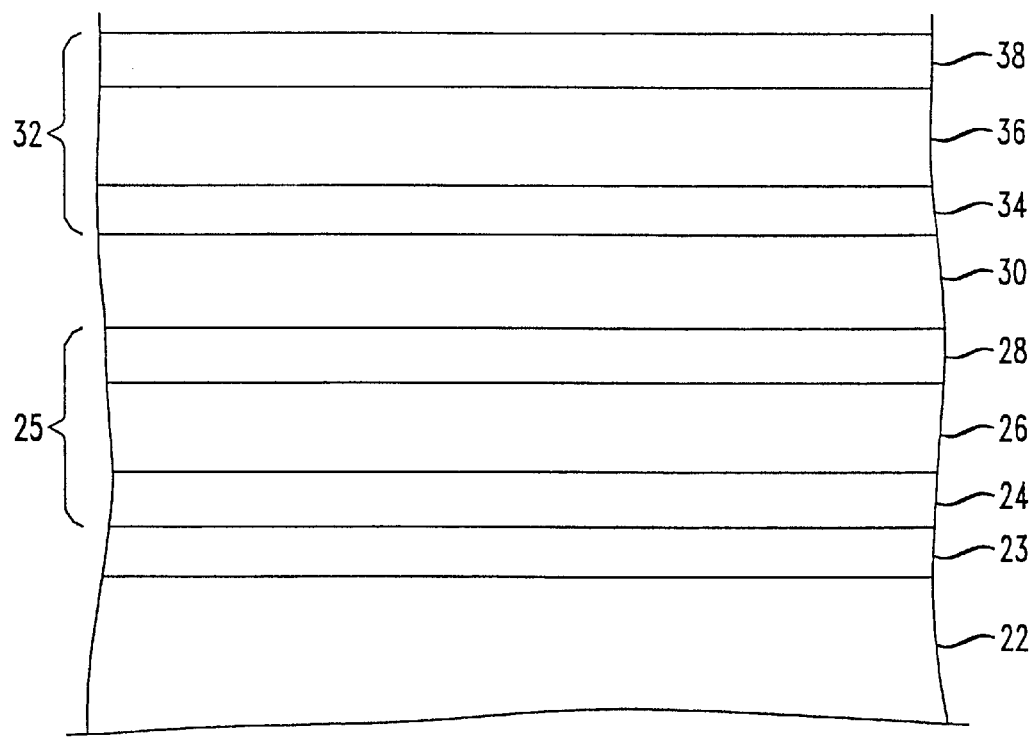
FIG. 3 is a cross-sectional view showing the formation of the upper and lower dielectric layers of the memory cell of FIG. 1 along with a sacrificial gate layer.

A first oxide layer 24 may be formed on the substrate 22 and connection line 23, as shown in FIG. 3, using conventional techniques as will be appreciated by those skilled in the art. At least one lower dielectric layer 25 is then illustratively formed, such as by depositing a second oxide layer 26 on top of the first oxide layer 24, and then depositing or forming a silicon nitride layer 28 on the second oxide layer 26. A sacrificial gate layer 30 may be formed on the silicon nitride layer 28. The sacrificial gate layer 30 is preferably an oxide layer.

Figure 4:
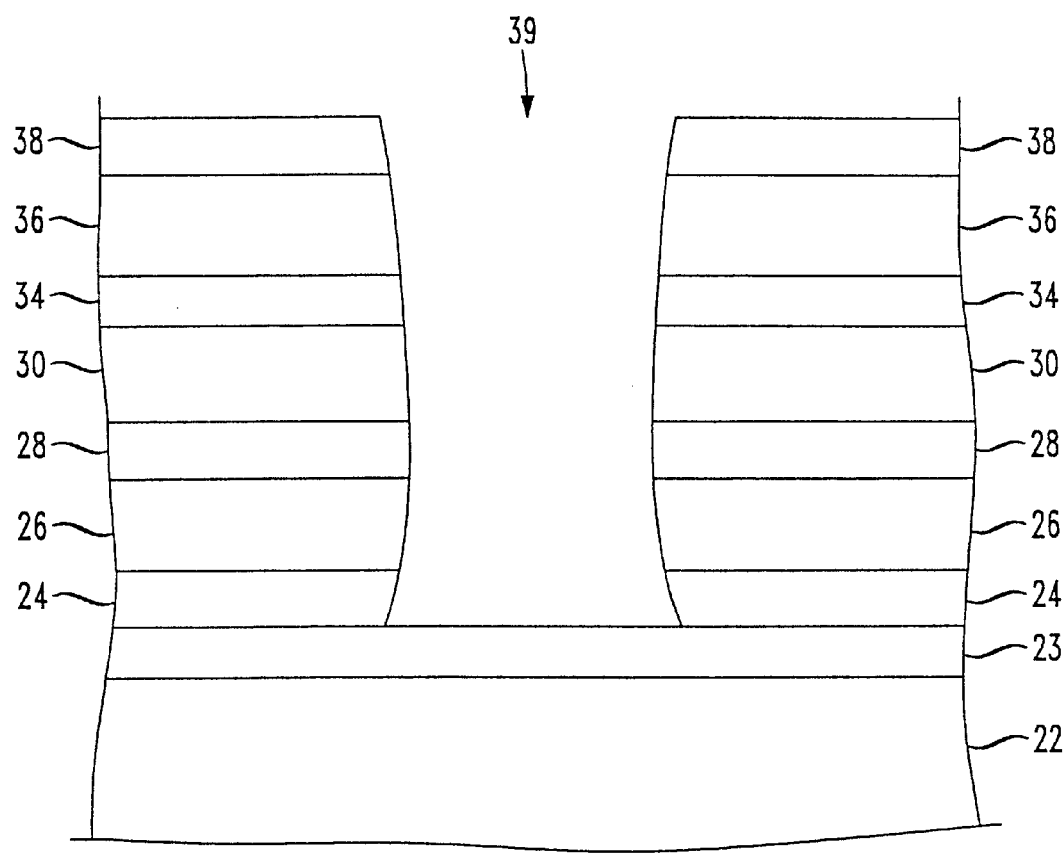
FIG. 4 is a cross-sectional view showing the formation of a window in the dielectric layers of FIG. 3.
Figure 5:
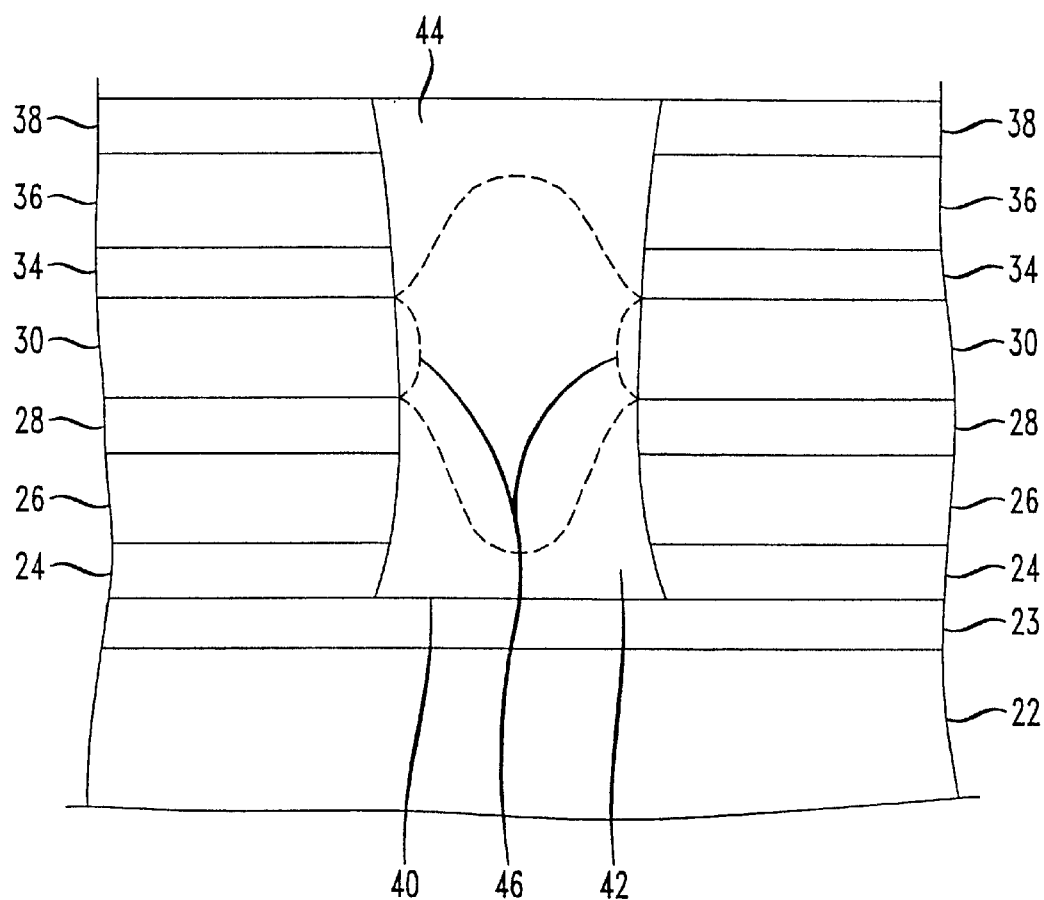
FIG. 5 is a cross-sectional view showing the formation of the pillar of the memory cell of FIG. 1.

At least one upper dielectric layer 32 is then illustratively formed, such as by depositing or forming a first silicone nitride layer 34 on the sacrificial gate layer 30, an oxide layer 36 on the first silicon nitride layer 34, and a second silicon nitride layer 38 on the oxide layer. Next, a window 39 is etched starting at the silicon nitride layer 38 and extending down to the connection line 23, as shown in FIG. 4. The window 39 may be formed using conventional lithographic techniques as will be appreciated by those skilled in the art. A pillar 40 is then formed in the window 39 of a single crystal semiconducting material, such as epitaxial silicon, as seen in FIG. 5. The pillar 40 is then doped so as to define the lower and upper source/drain regions 42 and 44, respectively, and a channel region 46, which are illustrated with dotted lines. The doping is further described in the above cited patent to Hergenrother et al.

Figure 6:
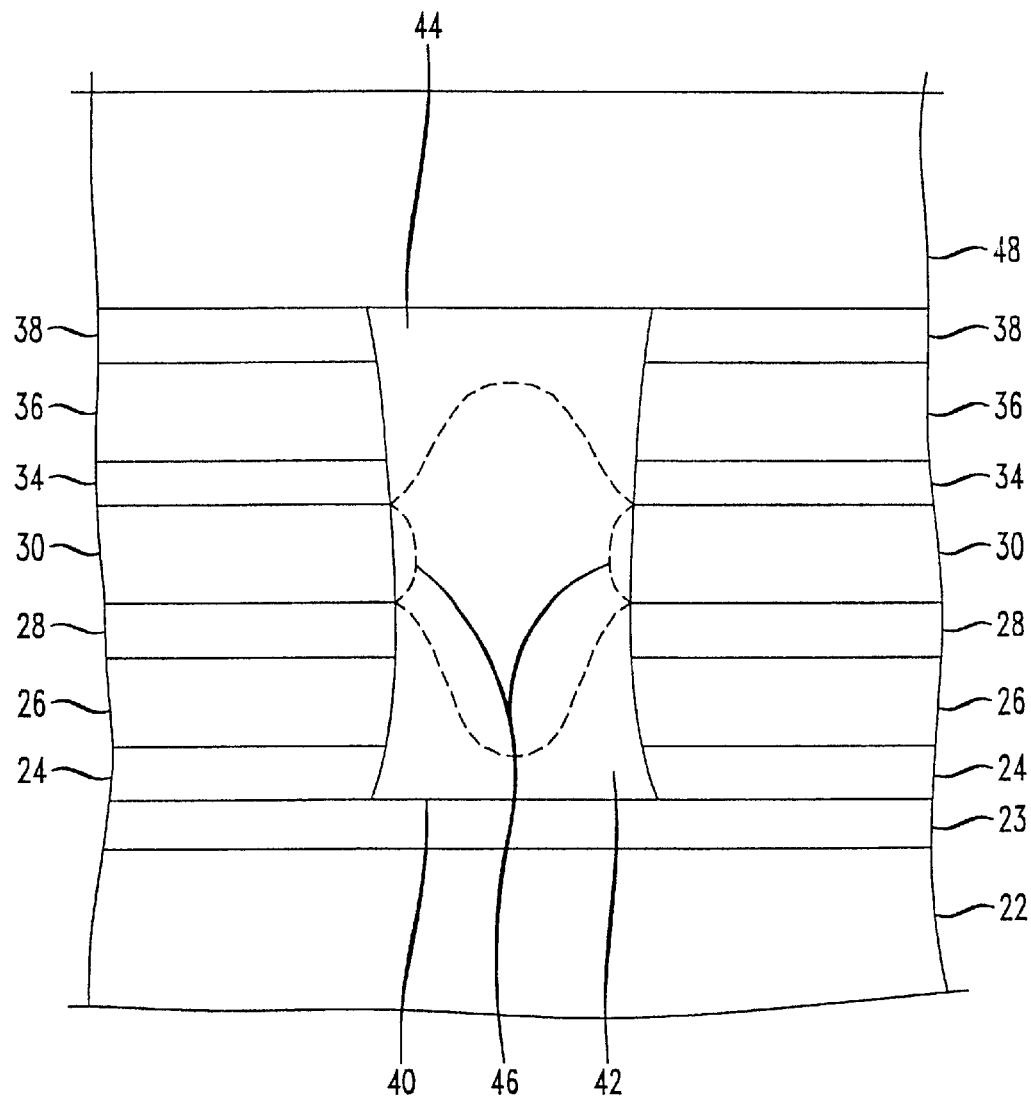
FIG. 6 is a cross-sectional view showing the formation of the conductive source/drain layer of the memory cell of FIG. 1.
Figure 7:
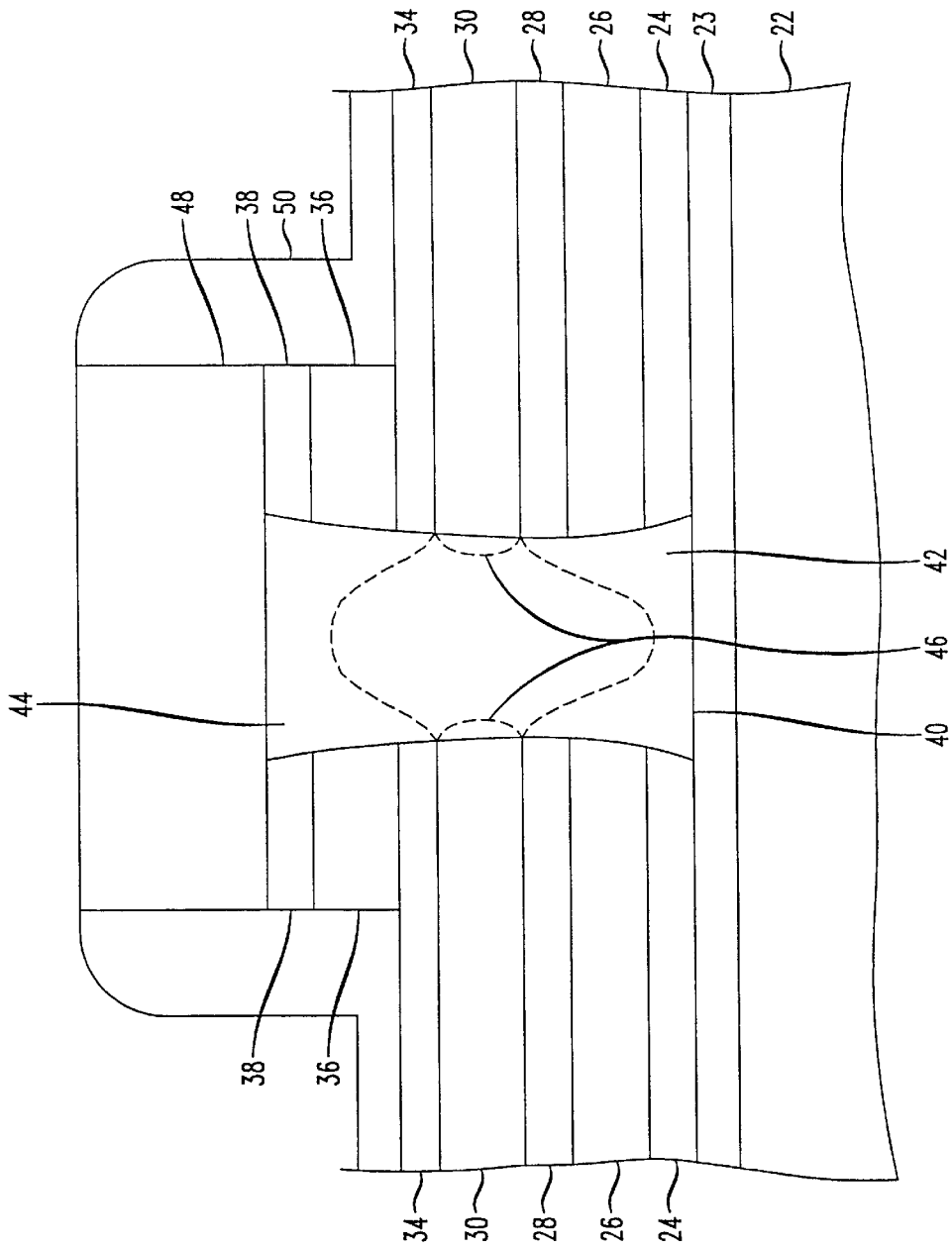
FIG. 7 is a cross-sectional view showing patterning of the upper dielectric layer and the conductive source/drain layer and the formation of the dielectric spacer of the memory cell of FIG. 1.

A conductive source/drain layer 48 is formed on top of the silicon nitride layer 38 and the upper source/drain region 44, as shown in FIG. 6. The conductive source/drain layer 48 may be formed of polysilicon or other suitable materials known in the art. The conductive source/drain layer 48, the silicon nitride layer 38, and the oxide layer 36 are then patterned on either side of the pillar 30, as shown in FIG. 7. The patterning is accomplished through conventional lithographic techniques.

Figure 8:
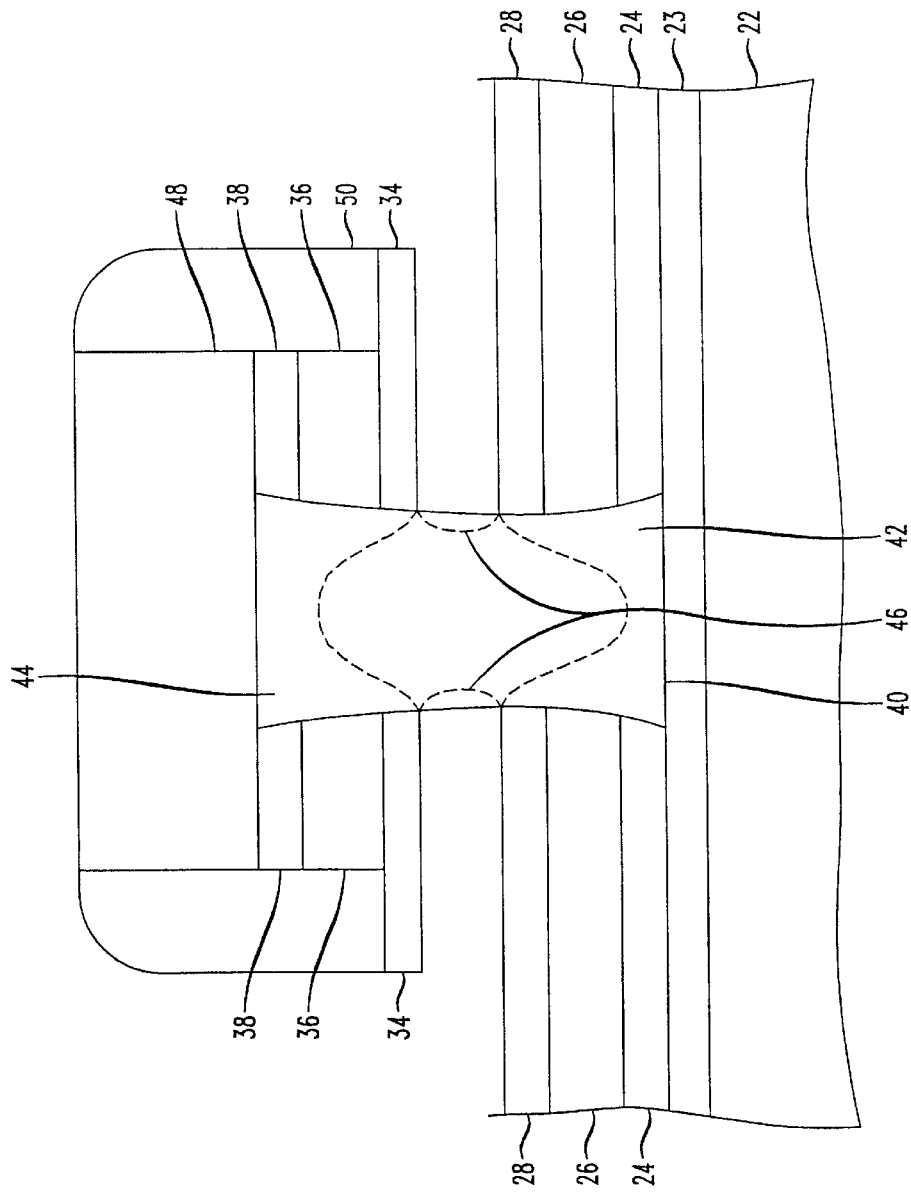
FIG. 8 is a cross-sectional view showing the removal of the sacrificial gate layer shown in FIGS. 3 through 7.

Next, a dielectric layer 50 is formed which will provide a dielectric spacer. The dielectric spacer 50 may also be silicon nitride. An anisotropic etchant, such as a dry plasma etch, may be used to remove portions of the dielectric layer 50 and silicon nitride layer 34, thus exposing the sacrificial gate layer 30, which can then be removed, as shown in FIG. 8. The sacrificial gate layer is removed by etching such as, for example, by wet etching (e.g., aqueous hydrofluoric acid) or isotropic dry etching (e.g., anhydrous hydrofluoric acid).

Figure 9:
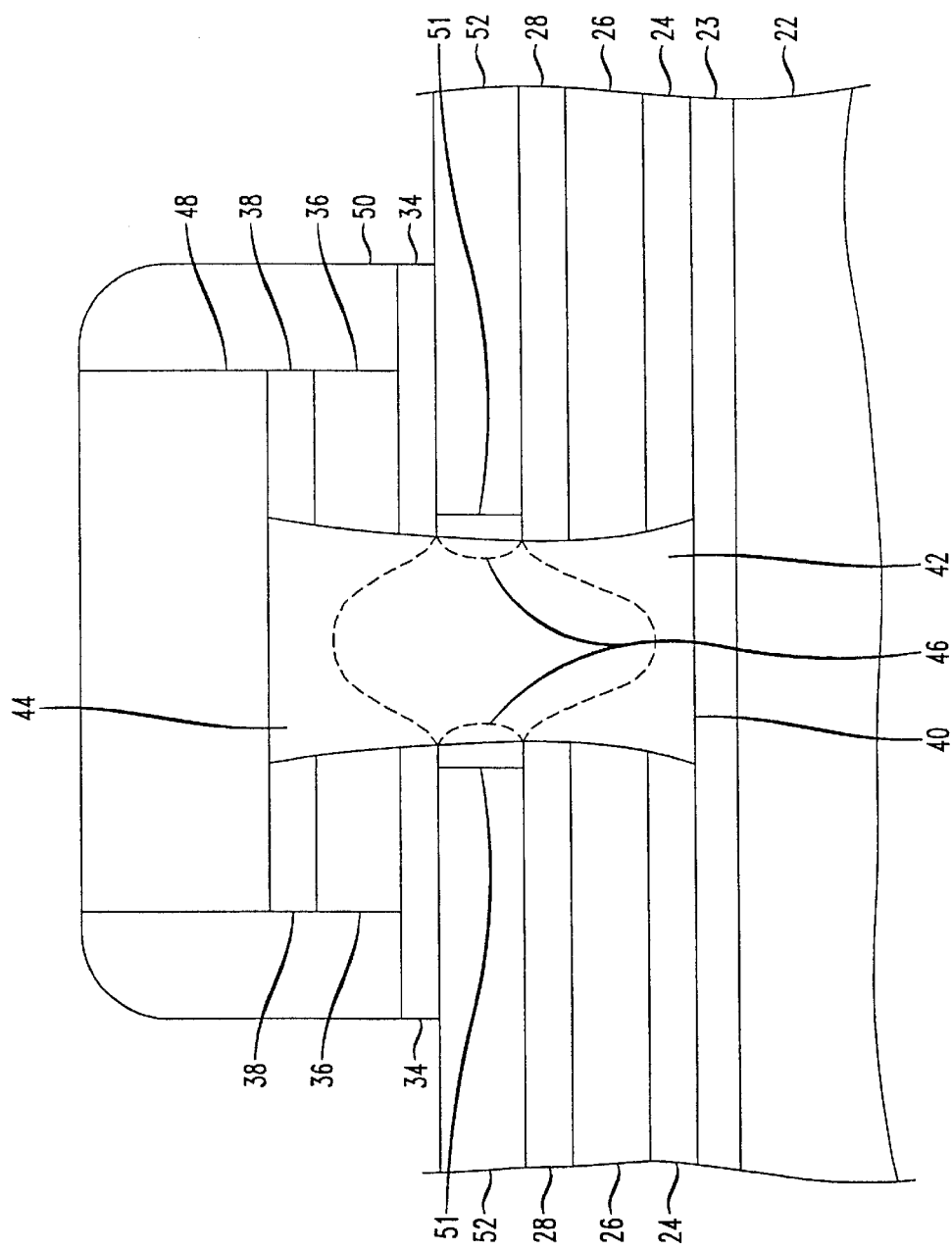
FIG. 9 is a cross-sectional view showing the formation of the gate oxide and conductive gate layers of the memory cell of FIG. 1.

A gate oxide layer 51 is then formed about the pillar 40 in the space formerly occupied by the sacrificial gate layer 30, as shown in FIG. 9. Of course, it will be appreciated that separate gate oxide layers could be formed adjacent the pillar 40 instead of the single gate oxide layer 51. A conductive gate layer 52 is then formed adjacent the gate oxide layer 51 and in the space formerly occupied by the sacrificial gate layer 30. Here again, it will be appreciated that separate conductive gate layers could be formed instead of the single conductive gate layer 52.

A silicon nitride layer 55 may then be added to the top of the conductive gate layer 52 so as to contact the dielectric spacer 50, as seen in FIG. 1. The storage capacitor of the memory cell 20 is then formed by depositing a first electrode layer 56 on the dielectric spacer 50 and the silicon nitride layer 55. A dielectric layer 58 is then formed on the first electrode layer 56, and a second electrode layer 60 is formed on the dielectric layer 58, thus completing the storage capacitor. The first and second electrode layers 56, 60 are shown to be metal in FIG. 1; however, other suitable conductive materials known to those skilled in the art would also suffice.

The dielectric spacer 50 is preferably generally rounded on its top portion so that it tapers toward the upper surface of the conductive source/drain layer 48. As such, the dielectric spacer SC provides a smooth arc for the first electrode layer 56 to be formed over and also provides increased area for the storage capacitor. Also, the dielectric spacer 50 prevents the formation of sharp angles in the storage capacitor, making the storage capacitor less susceptible to current leakage. However, the dielectric spacer 50 need not extend fully to the upper surface of the conductive source/drain layer 48 and over the silicon nitride layer 38. Further, separate dielectric spacers could be formed instead of the single dielectric spacer 50.

Figure 10:
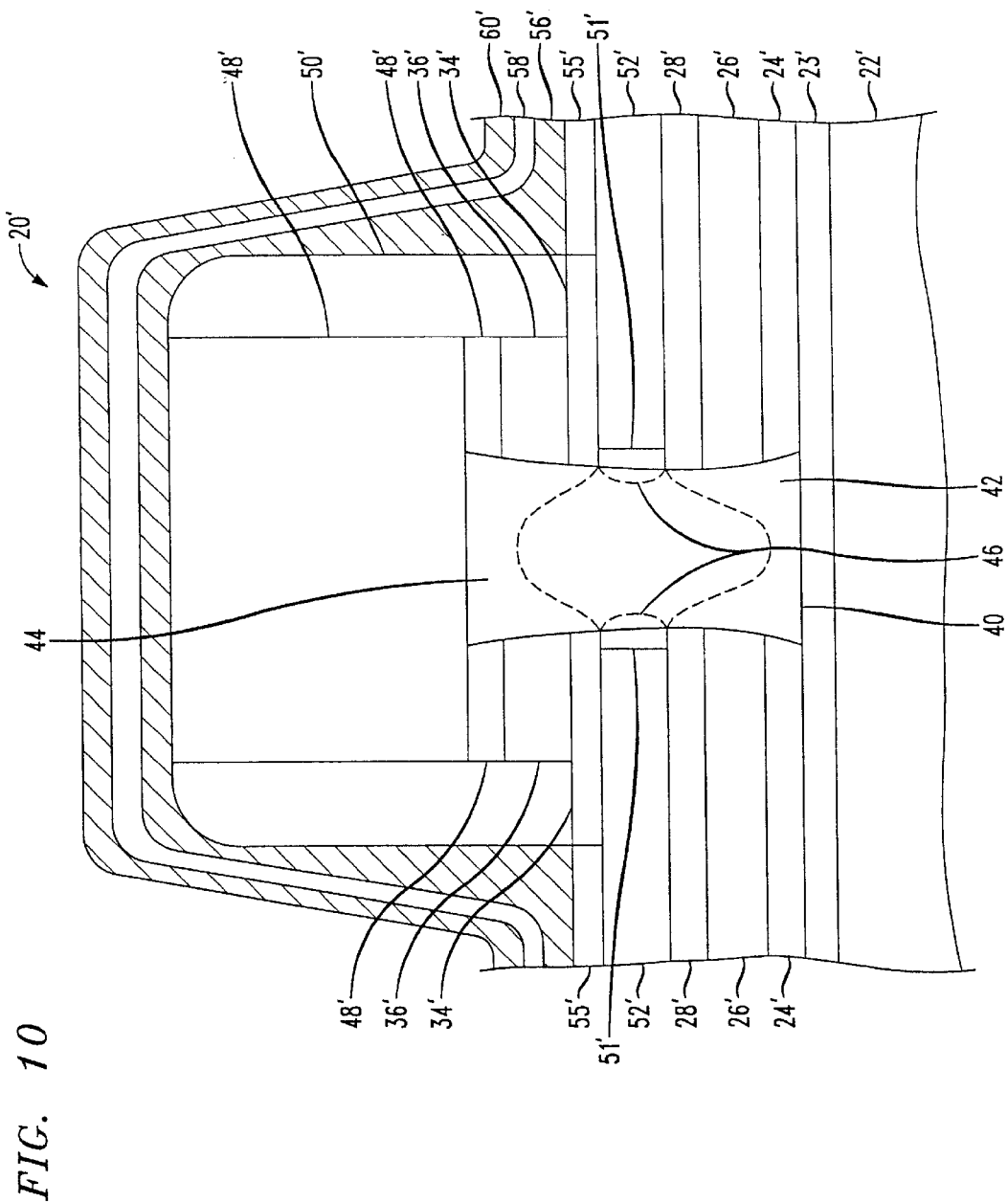
FIG. 10 is a cross-sectional view of an alternative embodiment of the memory cell of FIG. 1.

The capacitance of the storage capacitor can be adjusted by increasing or decreasing the height of the conductive source/drain layer 48. An alternate embodiment of the memory cell 20' is shown in FIG. 10. The conductive source/drain layer 48' has been vertically extended, resulting in a corresponding extension in the first and second electrode layers 56', 60' and the dielectric layer 58' of the storage capacitor. Such a vertical extension can be formed relatively easily and provides a relatively high capacitance to the storage capacitor of memory cell 20'. The other elements of the memory cell 20' are similar to those already described above and need no further discussion herein.

Figure 11:
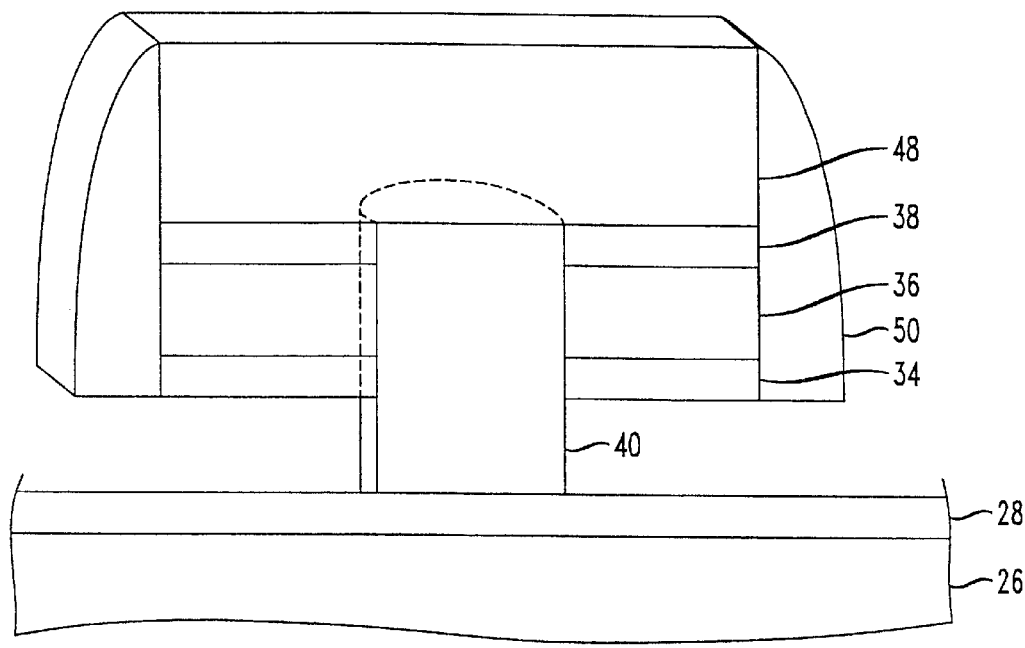
FIG. 11 is an elevational cross-sectional view of the memory cell of FIG. 1 having a generally cylindrical pillar shown after removal of the sacrificial gate layer.
Figure 12:
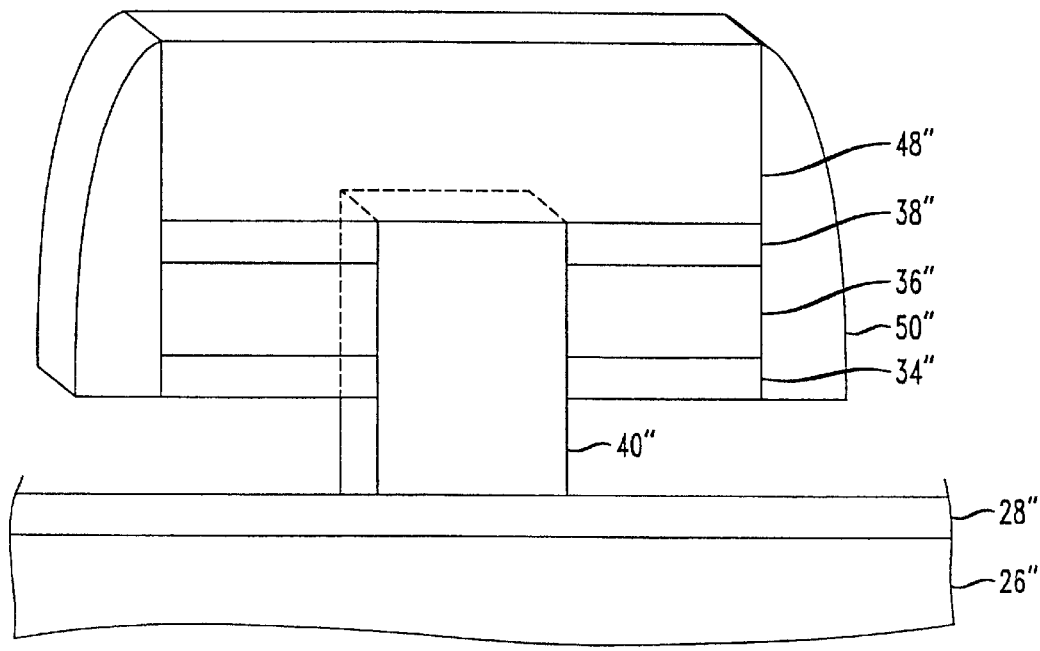
FIG. 12 is a elevational cross-sectional view of an alternate embodiment of the memory cell of FIG. 1 having a generally rectangular pillar shown after removal of the sacrificial gate layer.

The shape of the window 39 and, correspondingly, the shape of the pillar 40 may be generally cylindrical, as shown in FIG. 11. In an alternate embodiment, the pillar 40" can be formed in a generally rectangular shape, as shown in FIG. 12. However, those skilled in the art will appreciate that other geometries are also possible for the pillar 40, 40".

Figure 13:
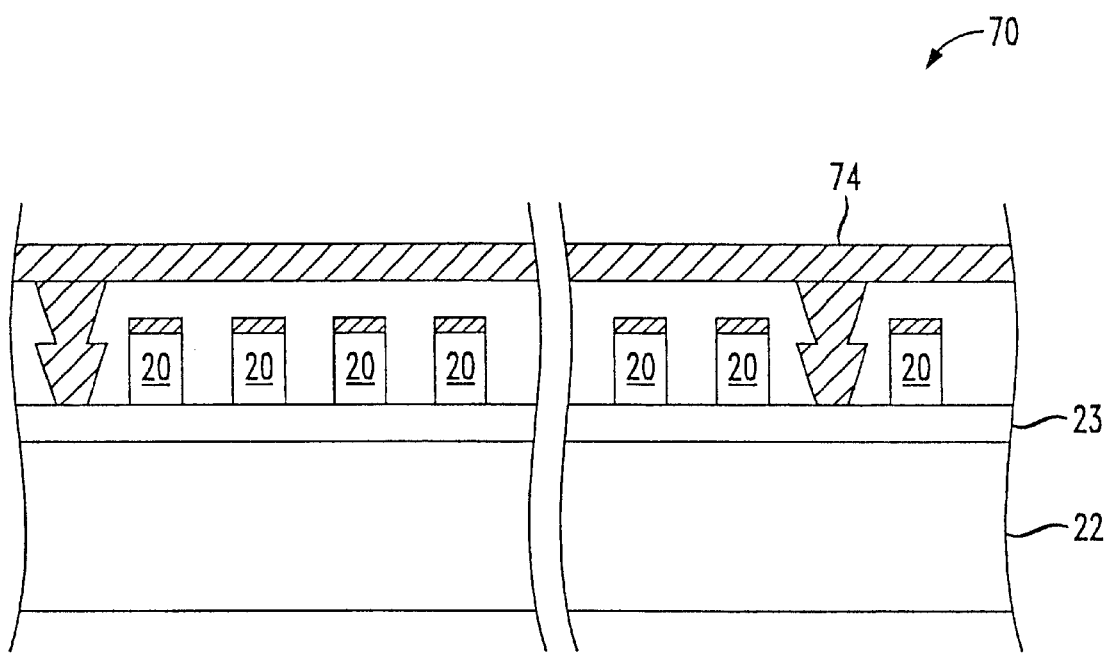
FIG. 13 is a cross-sectional view of a memory device including memory cells in accordance with the present invention.

A memory device 70 according to the present invention is shown in FIG. 13. The memory device 70 includes a plurality of memory cells 20 formed on the connection line 23 of the memory device, thereby defining a memory array. An electrically conductive line 74 is intermittently connected to the connection line 23 to lower an effective resistivity thereof. The electrically conductive line 74 may be metal although other suitable conductive materials would suffice.

Many modifications and other embodiments of the invention will come to the mind of one skilled in the art having the benefit of the teachings presented in the foregoing descriptions and the associated drawings. Therefore, it is to be understood that the invention is not to be limited to specific embodiments disclosed, and the modifications and embodiments are intended to be included within the scope of the appended claims.

That which is claimed is:

1. An integrated circuit memory device comprising:
    a substrate having at least one connection line therein; and
    a plurality of memory cells formed on said substrate, each memory cell comprising
        a cell access transistor pillar comprising a lower source/drain region electrically connected to said at least one connection line, an upper source/drain region, and at least one channel region extending vertically between said lower source/drain region and said upper source/drain region,
        a conductive source/drain layer on an upper surface of the upper source/drain region of said pillar and having an upper surface portion and vertical sidewall portions depending therefrom, and
        a storage capacitor having a portion extending along the upper surface portion and vertical sidewall portions of said conductive source/drain layer and having a portion extending below said conductive source/drain layer.

2. The integrated circuit memory device of claim 1 wherein said storage capacitor comprises:
    a first electrode layer adjacent the upper surface portion and vertical sidewall portions of said conductive source/drain layer and electrically connected thereto;
    a dielectric layer adjacent said first electrode layer; and
    a second electrode layer adjacent said dielectric layer.

3. The integrated circuit memory device of claim 1 further comprising at least one dielectric spacer positioned adjacent said vertical sidewall portions of said conductive source/drain layer.

4. The integrated circuit memory device of claim 1 wherein said conductive source/drain layer comprises polysilicon.

5. The integrated circuit memory device of claim 1 wherein said pillar comprises single crystal semiconducting material.

6. The integrated circuit memory device of claim 1 wherein said pillar comprises epitaxial silicon.

7. The integrated circuit memory device of claim 1 wherein said at least one connection line comprises at least one doped substrate region.

8. The integrated circuit memory device of claim 7 further comprising at least one electrically conductive line intermittently connected to said at least one doped substrate region to lower an effective electrical resistivity thereof.

9. The integrated circuit memory device of claim 7 further comprising:
- at least one lower dielectric layer vertically adjacent said substrate and laterally adjacent said pillar;
- at least one upper dielectric layer vertically spaced above said at least one lower dielectric layer and laterally adjacent said pillar; and
- at least one gate, wherein said at least one gate comprises:
  - a conductive gate layer between said at least one lower dielectric layer and said at least one upper dielectric layer; and
  - at least one gate oxide layer between said conductive gate layer and said pillar.

10. The integrated circuit memory device of claim 9 wherein said at least one gate comprises a pair of gates adjacent opposing sides of said pillar.

11. An integrated circuit memory device comprising:
- a substrate having at least one connection line therein;
- a plurality of memory cells formed on said substrate, each memory cell comprising
- a cell access transistor pillar comprising a lower source/drain region electrically connected to said at least one connection line, an upper source/drain region, a conductive source/drain layer located over said upper source/drain region, and at least one channel region extending vertically between said lower source/drain region and said upper source/drain region, and
- a storage capacitor electrically connected to and having a portion located over an upper surface of said conductive source/drain layer and having a portion extending below said conductive source/drain layer.

12. The integrated circuit memory device of claim 11 wherein said storage capacitor comprises:
- a first electrode layer adjacent said upper surface of said conductive source/drain layer of said pillar and electrically connected thereto;
- a dielectric layer adjacent said first electrode layer; and
- a second electrode layer adjacent said dielectric layer.

13. The integrated circuit memory device of claim 11 wherein said conductive source/drain layer comprises polysilicon.

14. The integrated circuit memory device of claim 11 wherein said pillar comprises single crystal semiconducting material.

15. The integrated circuit memory device of claim 11 wherein said substrate comprises silicon; and wherein said pillar comprises epitaxial silicon.

16. The integrated circuit memory device of claim 11 wherein said pillar is generally cylindrical in shape.

17. The integrated circuit memory device of claim 11 wherein said pillar is generally rectangular in shape.

18. The integrated circuit memory device of claim 11 wherein said conductive source/drain layer has an upper surface portion and vertical sidewall portions depending therefrom; and wherein said storage capacitor extends along the upper surface portion and vertical sidewall portions of said conductive source/drain layer to thereby provide increased area for said storage capacitor.

19. The integrated circuit memory device of claim 18 further comprising at least one dielectric spacer positioned adjacent said vertical sidewall portions of said conductive source/drain layer.

20. The integrated circuit memory device of claim 11 wherein said at least one connection line comprises at least one doped substrate region.

21. The integrated circuit memory device of claim 20 further comprising at least one electrically conductive line intermittently connected to said at least one doped substrate region to lower an effective electrical resistance thereof.

22. The integrated circuit memory device of claim 11 further comprising:
- at least one lower dielectric layer vertically adjacent said substrate and laterally adjacent said pillar;
- at least one upper dielectric layer vertically spaced above said at least one lower dielectric layer and laterally adjacent said pillar; and
- at least one gate, wherein said at least one gate comprises:
- a conductive gate layer between said at least one lower dielectric layer and said at least one upper dielectric layer; and
- at least one gate oxide layer between said conductive gate layer and said pillar.

23. The integrated circuit memory device of claim 22 wherein said at least one gate comprises a pair of gates adjacent opposing sides of said pillar.

24. The integrated circuit memory device of claim 22 wherein said at least one lower dielectric layer comprises an oxide layer on the substrate and a nitride layer on the oxide layer.

25. The integrated circuit memory device of claim 22 wherein said at least one upper dielectric layer comprises an oxide layer on the at least one gate and a nitride layer on the oxide layer.

* * * * *